Figure 1:
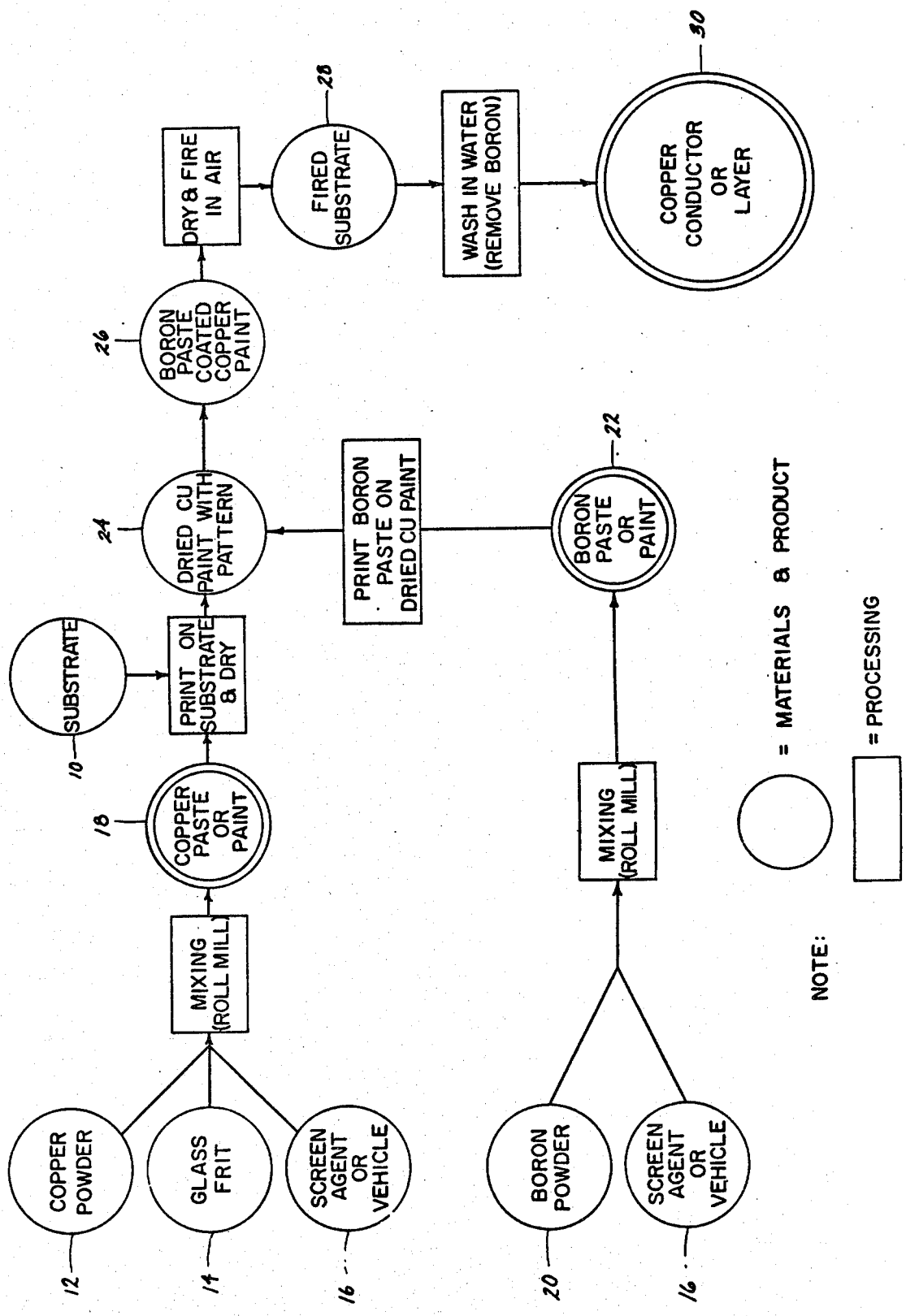

United States Patent [19]

Kuo

[11] 4,409,261
[45] Oct. 11, 1983

[54] PROCESS FOR AIR FIRING OXIDIZABLE CONDUCTORS

[75] Inventor: Charles Y. Kuo, Elkhart, Ind.

[73] Assignee: CTS Corporation, Elkhart, Ind.

[21] Appl. No.: 322,413

[22] Filed: Nov. 18, 1981

Related U.S. Application Data

[62] Division of Ser. No. 119,202, Feb. 7, 1980.

[51] Int. Cl.³ .............................................. B05D 5/12
[52] U.S. Cl. .................................... 427/96; 106/1.13;
    252/512; 428/427; 428/325; 428/201; 428/208;
    428/210; 428/699
[58] Field of Search .......................... 427/96, 102, 103;
    252/518, 512; 428/323, 325, 432, 427; 106/1.13

[56] References Cited

U.S. PATENT DOCUMENTS

| | | | |
|---|---|---|---|
| 2,993,815 | 7/1961 | Treptow | 427/96 |
| 3,016,037 | 10/1975 | Brady et al. | 427/101 |
| 3,929,674 | 12/1975 | Patterson et al. | 252/514 |
| 3,948,812 | 4/1976 | Corren et al. | 252/512 |
| 3,948,813 | 4/1976 | Holcombe, Jr. et al. | 252/520 |
| 4,067,736 | 1/1978 | Vartanian | 75/251 |
| 4,068,022 | 1/1978 | Glick | 427/125 |
| 4,070,517 | 1/1978 | Kazmierowicz | 428/209 |
| 4,072,771 | 2/1978 | Grier, Sr. | 427/96 |
| 4,122,232 | 10/1978 | Kuo | 428/323 |
| 4,140,817 | 2/1979 | Brown | 427/96 |
| 4,169,171 | 9/1979 | Narcus | 427/264 |
| 4,172,919 | 10/1979 | Mitchell | 428/209 |
| 4,248,921 | 2/1981 | Steigerwald et al. | |
| 4,316,920 | 2/1982 | Brown et al. | 427/96 |
| 4,316,942 | 2/1982 | Kuo | 427/96 |

Primary Examiner—George F. Lesmes
Assistant Examiner—E. Rollins Buffalow
Attorney, Agent, or Firm—John A. Young; Larry J. Palguta

[57] ABSTRACT

A thick film is formed initially as a paste and made up of such oxidizable conductor ingredients as copper which is then mixed with glass frit and next printed on a nonconductive inert substrate by silk screening. The silk screen printed thick film with vehicle is then dried, and a coating of boron in suitable paste or paint form having been mixed with a thixotropic organic vehicle is covered over the entirety of the substrate and silk screen printed thick film. The resulting product after a second air drying is then fired to bond the glass frit-copper as a thick film onto the substrate, with the copper particles being sintered throughout into a thick film. Superposed boron, where contiguous with the copper printing, is fused as a protective layer over the copper allowing the sintering of the copper and bonding with the substrate to occur without oxidation of the copper. Oxidized boron that covers portions of the substrate not occupied by the thick film and not superposing the copper layer is then washed away and the boron bonded to the copper remains as a protective coating.

15 Claims, 2 Drawing Figures

PROCESS FOR AIR FIRING OXIDIZABLE CONDUCTORS

This is a division of application Ser. No. 119,202, filed Feb. 7, 1980.

BACKGROUND OF THE INVENTION

An air firable base metal conductor has been the subject of considerable concern in the art. The unfortunate state of the art is that formulations of necessity frequently relied upon expensive metals such as silver, platinum, palladium, and gold because of their electrical properties and because they are relatively non-oxidizable when air fired. In order to obtain air firable thick film base metal conductors but without resorting to these precious metals, it is necessary to protect such thick film base metal conductors as copper against oxidation during the firing. This protection has taken two courses—(a) air firing within a protective atmosphere utilizing an inert gas such as nitrogen, argon, helium, etc., and (b) blending the base metal with such materials as boron which precludes or tends to suppress the oxidation of the copper during air firing. In both instances there are substantial disadvantages in the described approaches. For example, utilizing thick film conductors for electronic applications in a protective atmosphere necessitates the use of expensive auxiliary equipment thereby reducing the rate of production and entailing expensive monitoring devices for the protective atmosphere ovens. These expedients are part of the conventional art.

In the alternate expedient above described, that of compounding with the copper such antioxidants as boron, for them to be effective, stoichiometric excess is used to fully tie up any available oxygen which might otherwise oxidize the thick film conductor. Residual unreacted boron, being hygroscopic, tends upon aging of the product to change the electrical properties of the thick film copper and thus compromise its electrical properties. At the same time, the boron oxide adulterates the thick film and prevents the proper and effective electrical response which is needed for an optimum conducting function of the thick film. The high cost of the precious metals is a substantial offset to its advantageous physical properties. On the other hand, the non-precious metal compounds such as copper and its equivalents necessitate compounding with it additional materials which, while protecting the product against oxidation, impart undesirable aging properties and undesirable conducting properties to the copper. The other stated alternate to compounding is firing in a protective atmosphere which of necessity entails the use of expensive auxiliary equipment and a substantial number of rejected products. As a result, there is no practical method now in practice for producing a thick film of non-precious conductor material sintered to a non-conductive substrate, and which obviates either the use of a protective atmosphere or the compounding of the conductor with other ingredients which compromise the optimum properties of the copper or other electrically conductive material. Examples of an air firable base metal conductor which utilizes compounding auxiliary materials is found in my previous issued U.S. Pat. No. 4,122,232 issued Oct. 24, 1978 and titled "AIR FIRABLE BASE METAL CONDUCTORS."

There are a substantial number of other precious metal conductors which are not referenced in this disclosure because they are inherently objectionable by reason of their high cost to the extent of being virtually prohibitive except for very specialized applications.

RELATED PUBLICATIONS

Other examples of sintered, fired film in which cobalt is used as an additional ingredient are contained in U.S. Pat. No. 4,097,653, "COBALT BORIDE CONDUCTOR COMPOSITIONS" issued June 27, 1978.

SUMMARY OF THE INVENTION

The principal object of the present invention is to provide a sintered thick film conductor bonded to a substrate, but which is not inclusive of precious metals.

It is an object of the present invention to produce a thick film conductor for substrates, in which the thick film consists of an electrically conductive base metal consisting of copper or its equivalent, and which can be bonded to the substrate and wherein the particles will sinter together, and to achieve this by firing in a non-protective atmosphere.

It is another object of the present invention to provide a thick film electrically conductive base material such as copper or the like which can be air fired in a non-protective atmosphere to produce a fully conductive thick film which does not change in its electrical properties with age and whose electrical properties are unaffected by inclusions of substantial quantities of antioxidant material such as boron or the like.

It is another object of the present invention to provide a simple, effective method for atmospheric firing of thick film compositions utilizing copper, or its equivalent material, in which the copper is formed into a paste together with glass frit, the paste is silk screen printed or otherwise suitably added to a non-conductive substrate and dried, to be followed by covering the thick film and exposed substrate with a second paste material consisting of boron powder and a thixotropic vehicle that is printed or brushed over the entirety of the substrate and thick film and thereafter dried. After drying, the resulting material can be fired at 550° C. to 800° C. and then washed with water to remove the boron and boron oxide. The resulting configuration is a thick film having desirable electrical properties but protected by a super lamination of boron which does not in any way affect adversely the subsurface thick film of copper or its equivalent.

It is an important object of the present invention to provide products including thick-film base metal electrical conductors having a low sheet resistance that are manufactured in accordance with the foregoing process, and which by reason of their being fired in a non-protective atmosphere, are susceptible to large-scale manufacture in an economical manner, and which have electrical properties equivalent to precious metal thick films.

Other objects and features of the present invention will become apparent from a consideration of the following description which proceeds with reference to the accompanying drawings wherein selected example embodiments are illustrated by way of example and not by way of limitation.

DRAWINGS

FIG. 1 is a block diagram illustrating the process in its essential steps, the sequence followed in making an air-dried and then fired-in-air thick film which produces a superior electrically conductive thick film having both bond strength and satisfactorily fused to a non-conductive substrate.

Figure 2:
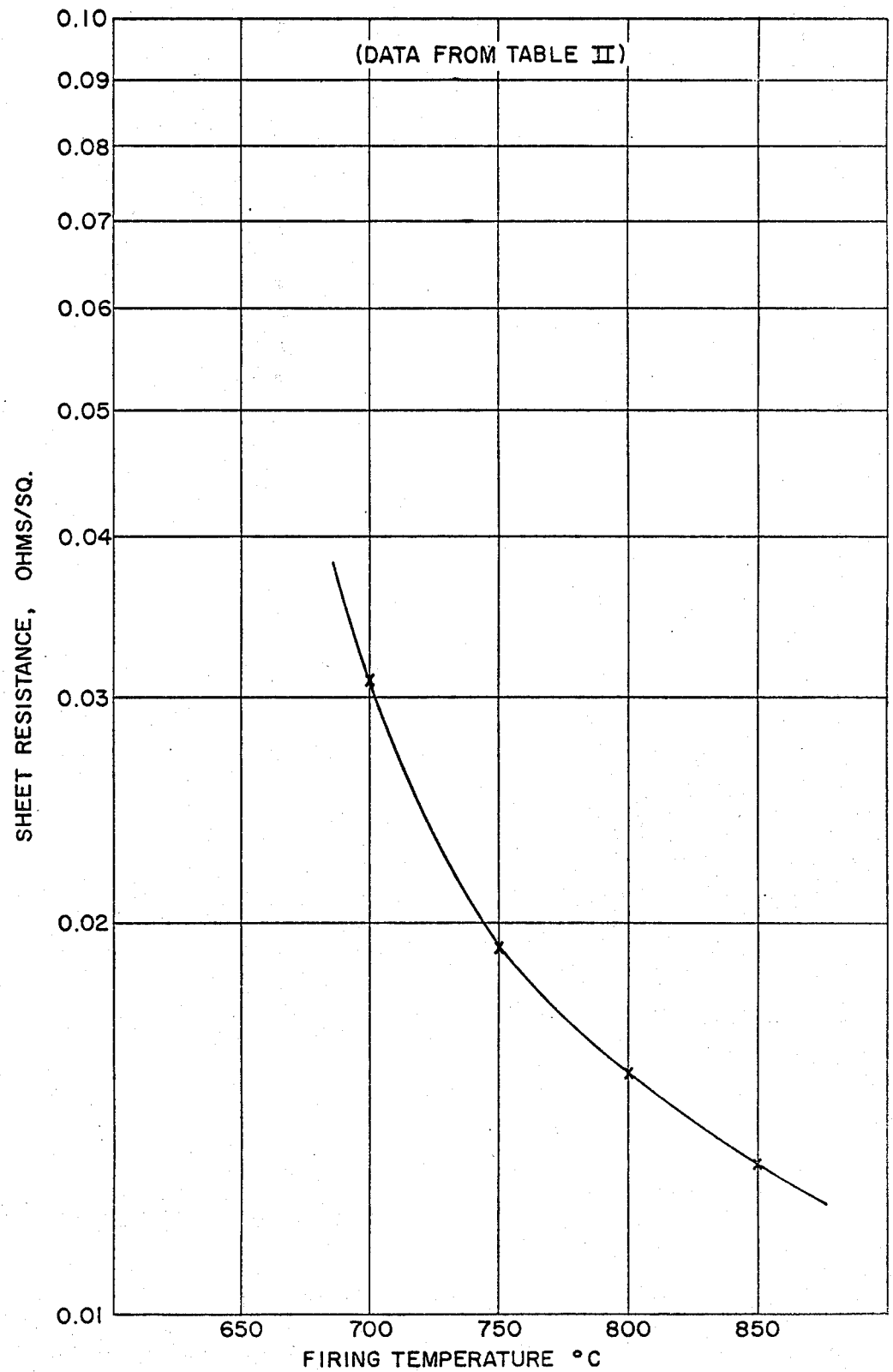

In the drawings FIG. 2 is a graph illustrating the effect of firing temperature on sheet resistence.

DESCRIPTION OF SELECTED EMBODIMENTS

The basic achievement of the present invention lies in the elimination of the need for protective atmosphere during firing of an air firable base metal conductor and further obviates blending or portioning with the base metal material an antioxidant such as boron.

The basic concept of the present invention as shown in FIG. 1 is to utilize two paste materials, the one paste material being made of copper powder, glass frit and vehicle consisting of a thixotropic organic such as ethyl cellulose dissolved in pine oil or terpineol and the other paste being made of boron and a vehicle as just described.

Ordinarily an air-fired base metal such as copper would be quickly oxidized, either totally destroying or seriously impairing the electrical conductivity. This would apply both in the case of copper, nickel, or other material which while having good electrical conductive properties when not oxidized, have much less desirable properties after being oxidized.

In the present invention, there is first utilized an electrically non-conductive inert substrate designated generally by reference numeral 10 in FIG. 1 and consisting essentially of glass, alumina, or other refractory material. The particular substrate does not form a part of the present invention, it only being required that the base material has the functional properties of electrical non-conductivity. Generally it is required that the material be somewhat flexible and inert, and unaffected by the processing temperatures which are hereafter described. The thick film base material has the functional requirement that it be of good electrical conductivity, that it be applicable to the substrate, and thereafter be bondable to the substrate and fused or sintered with respect to the constituent metal particles. It is the function of the glass frit 14 to enhance the bondability of the copper powder 12 to the substrate 10 and while being in sufficient amount to enhance the bondability and sinterability of the thick film constituent, not be present in such great quantities as to adversely affect the electrical properties of the thick film. It has been found that the range in both particle size and ratio of glass frit 14 to a copper powder 12 or other thick film material is governed by considerations of electrical properties, and the range of these materials is fixed in terms of the functional requirements of the product rather than a precisely determined weight ratio of the two components.

Nevertheless, within the functional boundaries noted, it is quite possible for those skilled in the art to determine the correct ratio for a given application particularly when considered against the background of the following examples. Typically, however, the copper powder 12 consists of pure copper powder having a particle size less than 325 mesh and preferably less than 1 to 5 micron. The material is obtained from Colonial Metals, Inc. or Cerac, Inc.

The glass frit 14 is any low-melting glass frit such as lead borosilicate frit having a particle size less than 325 mesh and preferably of a submicron size.

A screening agent or vehicle 16 is milled together with the copper powder 12 and glass frit 14 to produce a paste or paint 18. The screening agent 16 is typically any thixotropic organic such as ethyl cellulose dissolved into pine oil or terpineol with variable viscosities. The screen agent can be any liquid, preferably inert, that may be employed as the vehicle. The organic vehicles used to prepare the copper conductive pastes have not been found to be critical within the paste composition ranges given. Any organic vehicle which can disperse the small particles can be used. Typically, they will consist of a thickener, e.g., ethyl cellulose, and a liquid carrier such as terpineol, pine oil, esters, alcohols, ketones, acetone, or other organic solvents. Optionally, stabilizing agents and wetting agents may also be used. The vehicle will ordinarily make up 15–40 percent by weight of the finished paste when used for screen printing, although as little as 10 percent is possible. The amount of vehicle will be varied to adjust the viscosity of the finished paste as required by the application technique to be used. Greater amounts of solvents will be typically used with brushing techniques. For illustration, a heavy paste with a viscosity about 250 poise is typically used for screen printing, while a thinner paste with a viscosity of about 20 poise is typically used for dipping or brushing applications.

Once the copper powder 12, glass frit 14 and screening agent 16 are thoroughly mixed together by three-mill mixing to form the copper paste or paint 18, the paste 18 is applied to the substrate 10 by means of silk screening. It should be understood, however, that other applications are equally comprehended within the present invention including dipping, brushing, etc. The paint 18 is described as typically a ratio of solid to screening agent 16 in the range of 90 to 60 percent by weight of solids to 10 to 40 percent by weight of the screening agent 16.

Next, the copper paint 18 is heated at approximately 100° C. for about 15 minutes to thoroughly remove all of the solvent or volatilizable fraction from the paint, resulting in a substrate having dried copper paint 24 thereon.

Over this dried layer of paint 24 is painted a boron powder screening agent paste or paint 22 containing an amorphous boron powder 20 with a high percent of purity obtained from Fisher and typically in a submicron size. The boron powder must be of greater than 90–92% purity. Purity ranges of 95%–97% are acceptable however. The boron powder 20 is mixed with a screening agent or vehicle 16 which, as before, may consist of any thixotropic organic of the same composition as previously described, i.e. ethyl cellulose dissolved in pine oil or terpineol. The ratio of solids of boron powder 20 to screening agent 16 again is highly variable. After thoroughly painting the outer surface of the substrate and thick film (dried copper paint 24) with the boron paste 22, the boron paste coated copper paint 26 is then heated at approximately 100° C. for 15 minutes until as in the previous step there is a thorough drying of the boron paste lamination.

The boron paste coated copper paint 26 is next fired in an ordinary furnace at the temperature for sintering the glass frit, this being in the range of 550° C. to 800° C. at a firing time of from a few minutes to 15 minutes or longer to make sure that complete sintering of the constituent copper particles has occurred within the thick film and that there is a bonding of the entire film to the substrate. The overlayer of boron paint effectively protects the subsurface layer consisting of a thick film copper but the boron, other than that directly adjacent to the copper layer, is converted in a large part to boron oxide. This boron oxide is then removed after the conductor has been cooled and removal is by immersing the fired substrate 28 in warm soapy water to dissolve the boron oxide and wash away the excess boron.

There results a copper conductor or layer 30 having a bright copper or light reddish copper color which appears on the top surface and the characteristic of this surface is that it will readily accept soldering. It should be understood that the copper conductor or layer 30 does not have to be burnished or further treated, and that the finished product can be soldered with or without burnishing or chemical treatment. Likewise, the copper layer 30 can be modified by inclusion of other materials such as silver, palladium, platinum, gold, nickel, lead or other products which are readily alloyed with the thick film by admixing such constituent particles into the paint or paste. As described, the particular advantages of the present process as is now evident from FIG. 2 are that (a) no special furnace is required, (b) the product is fired in air, (c) it can be readily soldered, and (d) there is a very low sheet resistance in the sheet resistance range of 0.015 ohms/square.

An obvious advantage to the present invention is that a product can be produced at low cost and fired over a wide range of temperatures and useable with various substrates including but not necessarily limited to glass, alumina, enamel, or other substrates.

THE EFFECT OF GLASS FRIT TO THE CONDUCTOR LAYER

The following examples in Table I illustrate the effect of varying the ratio of glass frit to copper powder on the properties of the fired copper conductors. The properties of the copper powder used in the examples are as follows:

| Surface area: | 1.9 m$^2$/g |
| Particle Size*: | 0.9 micron |
| Tape Density: | 1.23 g/cm$^3$ |
| Scott Density: | 12.23 g/in$^3$ |
| Water: | 0.10% |

*Measured by Fisher sub-sieve sizer at 0.773 porosity.

The composition of the glass frit used in Table I is Glass frit I as listed in Table III.

TABLE I

EFFECTS OF RATIO OF GLASS FRIT TO COPPER POWDER ON PROPERTIES OF COPPER CONDUCTORS

|  | A1 | A2 | A3 | A4 | A5 | A6 | A7 |
|---|---|---|---|---|---|---|---|
| Cu Powder | 95 | 90 | 85 | 80 | 75 | 65 | 50 |
| Glass I | 5 | 10 | 15 | 20 | 25 | 35 | 50 |
| Screen Agent | 43 | 43 | 43 | 43 | 43 | 43 | 43 |
| Adhesion | P | GE | GE | GE | GE | F | P |
| Ohms per sq. | 0.018 | 0.013 | 0.012 | 0.012 | 0.014 | 0.015 | 0.015 |
| Solderability | P | F | GE | GE | GE | G | F |

Note:
[1]P — Poor, F — Fair, G — Good, E — Excellent
[2]The total solid is 100% and the ratio of solid to screen agent is approximately 70% to 30% weight percentage.
[3]The adhesion test was done by scotch tape and razor blade. By pressing scotch tape on the top of the copper film, if the top layer of the copper film can be peeled off, the adhesion is to be considered poor. If the copper film can pass the scotch tape test, but easily to be moved by razor blade, it is to be considered fair; otherwise the film is good.

It can be seen that if the glass frit is insufficient, (A1, i.e. 5% or less) the adhesion of the copper becomes inferior after the boron is washed out. The film just beneath the bright copper film is red or dark red cuprous oxide film. The film with bright copper color easily accepts soldering. Even red color films are solderable by using activated flux and a little longer time may be needed. If glass frit is excessive in the copper conductor, as in example A7 where the ratio of glass frit to copper powder is 50/50, the color of the copper conductor after washing becomes less yellowish and again the adhesion becomes inferior. Therefore, the preferred range of glass frit to copper powder is between 5/95 to 35/65 in the solid compositions.

EFFECT OF FIRING TEMPERATURE

The firing temperature and time for air firable copper conductors depends on the soft point and the amount of the glass frit. For low soft point frit, the firing temperature can be low, i.e. about 600° C. If the temperature is too high, the glass will bleed out from the copper. In general, the optimum firing temperature is between 600° to 650° C. As usual in the thick film conductors, the higher the firing temperature and the longer the time, the lower the resistance value as illustrated in FIG. 2.

TABLE II

EFFECTS OF FIRING TEMPERATURES ON PROPERTIES OF COPPER CONDUCTORS

1. FOR COMPOSITION A6 (65cu/35 FRIT I)
(10 Minutes at Peak Temperature)

|  | 650° C. | 700° C. | 750° C. | 800° C. | 850° C. |
|---|---|---|---|---|---|
| Color | Dark Red | cu | cu | cu | cu |
| Ω/sq. | 0.065 | 0.02 | 0.013 | 0.013 | 0.013 |
| Solderability | P | G | GE | GE | G |

2. FOR A4 (80cu/20 FRIT I)

|  | 650° C. | 700° C. | 750° C. | 800° C. | 850° C. |
|---|---|---|---|---|---|
| Color | Dark Red | Light Red | cu | cu | cu |
| Ω/sq. | N.R. | 0.031 | 0.019 | 0.015 | 0.013 |
| Solderability | P | PF | GE | GE | G |

Note:
The fired film becomes blistered after 800° and 850° C., but the color and sheet resistance are acceptable for certain applications. N.R. = No reading.

The firing time at peak temperature can vary from 1 to 20 minutes to yield reproducible results. Most of the examples used in this application are glass frit I, i.e. lead borosilicate glass. Table III is a list of various glass frit which have shown good results.

TABLE III

GLASS FRIT COMPOSITIONS (WEIGHT %)

| Glass No. | I | II | III | IV | V | VI | VII |
|---|---|---|---|---|---|---|---|
| PbO | 80 | 63 | 50 | 20 | 55 | 50 | 68.5 |
| SiO$_2$ | 10 | 12 | 15 | 15 | 15 | — | 12.5 |
| B$_2$O$_3$ | 10 | 25 | 10 | 10 | 10 | — | 9.0 |
| Bi$_2$O$_3$ | — | — | — | 50 | — | — | — |
| PbF$_2$ | — | — | 25 | 5 | 15 | 50 | — |
| Na$_2$O | — | — | — | — | 5 | — | — |
| CuO | — | — | — | — | — | — | 5 |
| ZnO | — | — | — | — | — | — | 5 |

Again, the ratio of glass frit to copper powder is in the range of about 10% to 35% glass to 90 to 65% of copper powder.

EFFECT OF DIFFERENT ADDITIVES

Different additives such as precious metals Cu$_2$O, CuO, Bi$_2$O$_3$, Ni, Al, Bi, Si, CdO and the mixed glass frits have been added to the main composition to improve the properties. Examples are listed in Table IV. (The copper compositions may also contain minor amounts of additional constituents which may modify and/or improve the properties of the fired elements.)

TABLE IV

COPPER CONDUCTORS WITH VARIOUS ADDITIVES

| Solid Compositions | B1 | B2 | B3 | B4 | B5 | B6 | B7 | B8 | B9 | B10 |
|---|---|---|---|---|---|---|---|---|---|---|
| Cu Powder | 80.8 | 85 | 89.4 | 86 | 90 | 80.5 | 87 | 85 | 86 | 85 |
| Glass Frit I | 11.0 | — | 4.3 | 12 | — | 12.0 | — | 13.5 | — | 12 |
| Boron Powder | — | 1 | 2.0 | 2 | — | — | 1 | — | 2 | 3 |
| Ag Powder | 4.5 | — | — | — | — | 4.5 | — | — | — | — |
| $Bi_2O_3$ Powder | 3.7 | — | — | — | — | 2.0 | — | 0.5 | — | — |
| $PbF_2$ Powder | — | — | — | — | 5 | — | — | — | — | — |
| PbO Powder | — | — | — | — | 5 | — | — | — | 4 | — |
| Glass Frit II | — | 14 | 4.3 | — | — | — | 12 | — | 8 | — |
| CuO | — | — | — | — | — | 1.0 | — | 0.5 | — | — |
| CdO | — | — | — | — | — | — | — | 0.5 | — | — |
| ohms/square | .011 | .009 | .012 | .012 | .012 | .010 | .012 | .010 | .011 | .009 |
| adhesion | G | G | E | E | F | E | G | G | G | E |
| solderability | G | GE | E | GE | G | GE | GE | G | G | E |

DIFFERENT SUBSTRATES

Different substrates such as alumina, enamel, pyrex and soda lime glass have been applied. For soda lime glass and enamel substrate, a low soft glass frit may be used in the copper paint, such as Glass I in Table III. The copper conductor paints to be fired on soda lime glass or enamel substrate need less glass frit in the composition than those to be fired on alumina substrates. For ordinary glass, the firing temperature can not be over 650° C.

The purity of amorphorous boron for protecting oxidation of copper is important. If a low-grade boron is used, it is not enough to insure the full protection. Hydrochloric acid can be used to purify the boron powder. The boron protection sometimes may need a second coat to insure no oxidation in copper.

OPTIMIZING CONDITIONS

For optimum results copper is used in 50% or more submicron size, less than 10 micron. A frit of borosilicate has a soft point less than 600° C. and a particle size less than 5 micron above 5% and up to 35% by weight.

Additives most greatly improving adhesion are CuO, $Cu_2O$, CdO, $Bi_2O_3$ in powder form up to 10% (up to 50% in the glass).

Boron can be admixed in the paint when less than 5% to prevent oxidation in the gradients of the copper conductors.

The preferred embodiments are illustrated as A3, A4, B2, B3, B4, B7 and B10.

Although the present invention has been illustrated and described in connection with certain example embodiments which are selected by way of illustration, it will be understood that these are illustrative of the invention and are by no means restrictive thereof. It is reasonably to be expected that those skilled in the art can make numerous revisions and adaptations of the invention and it is intended that such revisions and adaptations will be included within the scope of the following claims as equivalents of the invention.

What is claimed as new and desired to be secured by Letters Patent of the United States is:

1. A method of forming a thick film electrical conductor on a non-conductive substrate wherein the resistance is less than one ohm per square, comprising the steps of intimately mixing a copper powder, glass frit and vehicle to form a printable mixture, printing the mixture on a non-conductive substrate and thereafter drying the mixture, preparing a combination of boron powder and vehicle which are intimately mixed together and applying the boron powder-vehicle mixture over the entire surface of the previously printed and dried mixture, drying the boron powder-vehicle mixture, firing the boron on top of the printed copper powder and glass frit mixture, and finally washing with water to remove the boron and boron oxide from the surface of the substrate and overlying printed surface.

2. The process in accordance with claim 1 in which the substrate material is selected from the group consisting of glass, alumina, and enamel materials.

3. The process in accordance with claim 1 in which the substrate consists of a material which is non-reactive with the printed surface and electrically non-conductive.

4. The process in accordance with claim 1 including the step of firing at a temperature between 550° C. to 800° C.

5. The process in accordance with claim 1 including the step of roll milling the copper powder, glass frit, and vehicle together to form a viscous copper paint which is adapted for printing onto the surface of the substrate and applying a pattern of such paint to the substrate by a silk screen procedure.

6. The process in accordance with claim 1 including the step of roll milling together the boron powder and vehicle, the boron powder consisting of an amorphous boron powder of submicron size and a purity of at least 90–97 percent.

7. The process in accordance with claim 1 in which said glass frit consists of lead borosilicate frit of a particle size less than 325 mesh.

8. The process in accordance with claim 1 in which the boron powder is mixed with a thixotropic organic in the form of ethyl cellulose dissolved in a material selected from a group consisting of pine oil and terpineol.

9. The process in accordance with claim 1 in which the solderability of said materials is modifiable by the inclusion of a metal selected from the group consisting of silver, palladium, platinum, gold, nickel, and lead.

10. The process in accordance with claim 1 in which the copper powder and glass frit are mixed together in the ranges of 10 to 35 percent by weight frit together with 90–65 percent by weight copper powder and wherein said glass frit forms the bonding between the copper powder particles and the copper powder particles to the substrate.

11. The process in accordance with claim 1 in which the printable mixture has a ratio of solid to vehicle in the range of 90–60 percent solid to 10–40 percent vehicle.

12. The process in accordance with claim 1 in which the printable mixture is printed onto the substrate through a screen, said substrate consisting of a material selected from the group consisting of glass and alumina.

13. The process in accordance with claim 1 in which the drying of the printable mixture on the substrate is at approximately 100° C. for 15 minutes, and the surface of the substrate is then covered with the boron powder vehicle mixture.

14. The process in accordance with claim 13 in which the boron powder-vehicle mixture covering the printed copper powder-glass frit mixture is dried, and thereafter fired at a range of 550° C. to 800° C. and for a time period ranging from approximately three minutes to approximately 15 minutes.

15. The process in accordance with claim 1 in which the step of washing is carried out with warm soapy water to dissolve the boron oxide and remove the excess boron.

* * * * *